United States Patent
Gifford et al.

(10) Patent No.: US 6,946,853 B2
(45) Date of Patent: Sep. 20, 2005

(54) NON-CONTACT PROXIMITY SENSOR

(75) Inventors: Carl W. Gifford, Barrie (CA); Kathryn Petroff, East York (CA); Mirko Pribisic, North York (CA)

(73) Assignee: Intier Automotive Closures Inc., Newmarket (CA)

( * ) Notice: Subject to any disclaimer, the term of this patent is extended or adjusted under 35 U.S.C. 154(b) by 14 days.

(21) Appl. No.: 10/480,074

(22) PCT Filed: Jun. 10, 2002

(86) PCT No.: PCT/CA02/00880

§ 371 (c)(1),
(2), (4) Date: Dec. 8, 2003

(87) PCT Pub. No.: WO02/101929

PCT Pub. Date: Dec. 19, 2002

(65) Prior Publication Data

US 2004/0178924 A1 Sep. 16, 2004

Related U.S. Application Data

(60) Provisional application No. 60/296,483, filed on Jun. 8, 2001.

(51) Int. Cl.$^7$ .............................................. G01R 27/26
(52) U.S. Cl. ....................................... 324/686; 324/658
(58) Field of Search ......................... 324/658, 676–684, 324/686–688; 178/20.04; 318/280, 480

(56) References Cited

U.S. PATENT DOCUMENTS

| | | | |
|---|---|---|---|
| 4,943,757 A | 7/1990 | Richter et al. | 318/468 |
| 4,944,116 A | 7/1990 | Mewald | 49/27 |
| 5,074,073 A | 12/1991 | Zwebner | |
| 5,191,268 A | 3/1993 | Duhame | 318/266 |
| 5,326,967 A | 7/1994 | Herrmann et al. | 250/221 |
| 5,334,876 A | 8/1994 | Washeleski et al. | 307/10.1 |
| 5,422,551 A | 6/1995 | Takeda et al. | 318/265 |
| 5,730,165 A | 3/1998 | Philipp | 137/1 |
| 5,801,340 A | 9/1998 | Peter | 178/20.04 |
| 5,955,854 A | 9/1999 | Zhang et al. | 318/480 |
| 6,051,945 A | 4/2000 | Furukawa | 318/280 |
| 6,135,494 A * | 10/2000 | Lotito et al. | 280/731 |
| 6,163,080 A | 12/2000 | Castellon | 307/10.1 |

FOREIGN PATENT DOCUMENTS

| | | |
|---|---|---|
| CA | WO 02/12669 | 2/2002 |
| EP | 1 072 894 | 1/2001 |
| GB | 2 319 294 | 5/1998 |
| GB | WO 01/08925 | 2/2001 |
| WO | WO 00/44018 | 7/2000 |

* cited by examiner

Primary Examiner—Vincent Q. Nguyen
(74) Attorney, Agent, or Firm—Clark Hill PLC

(57) ABSTRACT

A controller for a vehicular power accessory includes an elongate sensor electrode (102), a capacitive shield (104) extending significantly beyond the sensor electrode (102). A dielectric (106) is disposed between the capacitive shield (104) and the sensor electrode (102) to isolate the sensor electrode (102) from the capacitive shield (104). A sensor processor (114) is in electrical communication with the sensor electrode (102) for processing sense data received from the sensor electrode (102). A power actuator (202) is in electrical communication with the sensor processor (114) for effecting movement of the power accessory in accordance with the processed sense data. The sensor electrode (102) can be applied to various vehicle locations with the purpose of detecting obstacles and activating an alarm or display.

18 Claims, 4 Drawing Sheets

NON-CONTACT PROXIMITY SENSOR

This application claims the benefit of provisional application No. 60/296,483, filed Jun. 8, 2001.

FIELD OF THE INVENTION

The present invention relates to a non-contact proximity sensor. In particular, the present invention relates to a capacitive sensor for use in controlling movement of a power accessory in an automobile.

BACKGROUND OF THE INVENTION

Proximity sensors are widely used in the automotive industry to automate the control of power accessories. For instance, proximity sensors are often used in power window controllers to detect the presence of obstructions in the window frame when the window pane is being directed to the closed position.

One proximity sensor commonly used as a power window controller comprises a voltage sensor coupled between the window actuator and the actuator power source. When an obstruction is encountered in the window frame as the window is closing, the obstruction increases the electrical load imposed on the window actuator, thereby causing the load voltage at the window actuator to drop. The voltage sensor is configured to sense any drop in load voltage and to command the window actuator to stop or to reverse the direction of movement of the window pane when such a voltage drop is detected.

Another proximity sensor commonly used as a power window controller comprises a speed sensor coupled to the window actuator. When an obstruction is encountered in the window frame as the window is closing, the obstruction increases the mechanical load imposed on the window actuator, thereby causing the speed of the actuator to drop. The speed sensor is configured to sense any change in actuator speed and to command the window actuator to stop or to reverse the direction of movement of the window pane when such a change in actuator speed is detected.

Another proximity sensor employed comprises a pressure sensitive strip disposed around the upper edge of the window frame. When an obstruction is detected between the window pane and the window frame, the pressure sensitive strip signals the window actuator to stop further movement of the window pane.

Although voltage sensors, speed sensors and pressure sensors are commonly used in power window controllers, they cannot react with sufficient speed to prevent an obstruction, such as a hand, from being pinched between the window pane and the window frame. Consequently, attempts have been made to improve upon the conventional proximity sensor mechanism.

For instance, Peter (U.S. Pat. No. 5,801,340) teaches a solution which uses a capacitive sensor mounted on the weather seal at the top of the window frame. The capacitive sensor comprises a first insulating layer disposed over the window sheet metal, a conductive guard layer disposed over the first insulating layer, a second insulating layer disposed over the guard layer, and a touch plate disposed over the second insulating layer. The guard layer is driven by an alternating voltage signal which is identical in amplitude and phase to the voltage imposed on the touch plate. With this arrangement, capacitance between the touch plate and the window sheet metal is cancelled out, thereby increasing the sensitivity of the sensor to capacitive changes arising from obstructions in the window frame.

Although Peter allows the window actuator to respond more rapidly to obstructions in the window frame, Peter requires that the guard layer be the same size as the touch plate for optimum cancellation of touch plate capacitance. In fact, Peter points out that if the guard plate extends beyond the touch plate, the sensitivity of the sensor to obstructions will be reduced. Consequently, Peter discloses that the guard layer extends only $10/1000$th of an inch beyond the touch plate. The disclosed manufacturing tolerances can greatly increase the manufacturing cost of the capacitive sensor. Consequently, there remains a need for a proximity sensor which will not allow an obstruction to become pinched between the window pane and the window frame when the window pane is being directed to the closed position.

SUMMARY OF THE INVENTION

The disadvantages of the prior art may be overcome by providing a capacitive sensor that can be used as a non-contact pinch sensor and a non-contact obstacle sensor.

According to one aspect of the present invention, there is provided a capacitive proximity sensor which includes an elongate sensor electrode, a conductive metal sheet extending significantly beyond the sensor electrode, a dielectric disposed between the metal sheet and the sensor electrode, a substrate layer, and a dielectric layer interposed between the substrate layer and the conductive metal sheet and bonded to the substrate and the metal sheet.

According to another aspect of the present invention, there is provided a vehicular power accessory controller which includes an elongate sensor electrode, a capacitive shield extending significantly beyond the sensor electrode, a dielectric disposed between the capacitive shield and the sensor electrode and bonded to the sensor electrode from the capacitive shield, a sensor processor in electrical communication with the sensor electrode for processing sense data received from the sensor electrode, and a power accessory actuator in electrical communication with the sensor processor for effecting movement of the power accessory in accordance with the processed sense data:

BRIEF DESCRIPTION OF THE DRAWINGS

The present invention will now be described, by way of example only, with reference to the accompanying drawings, in which.

DETAILED DESCRIPTION OF THE PREFERRED EMBODIMENT

Figure 1:
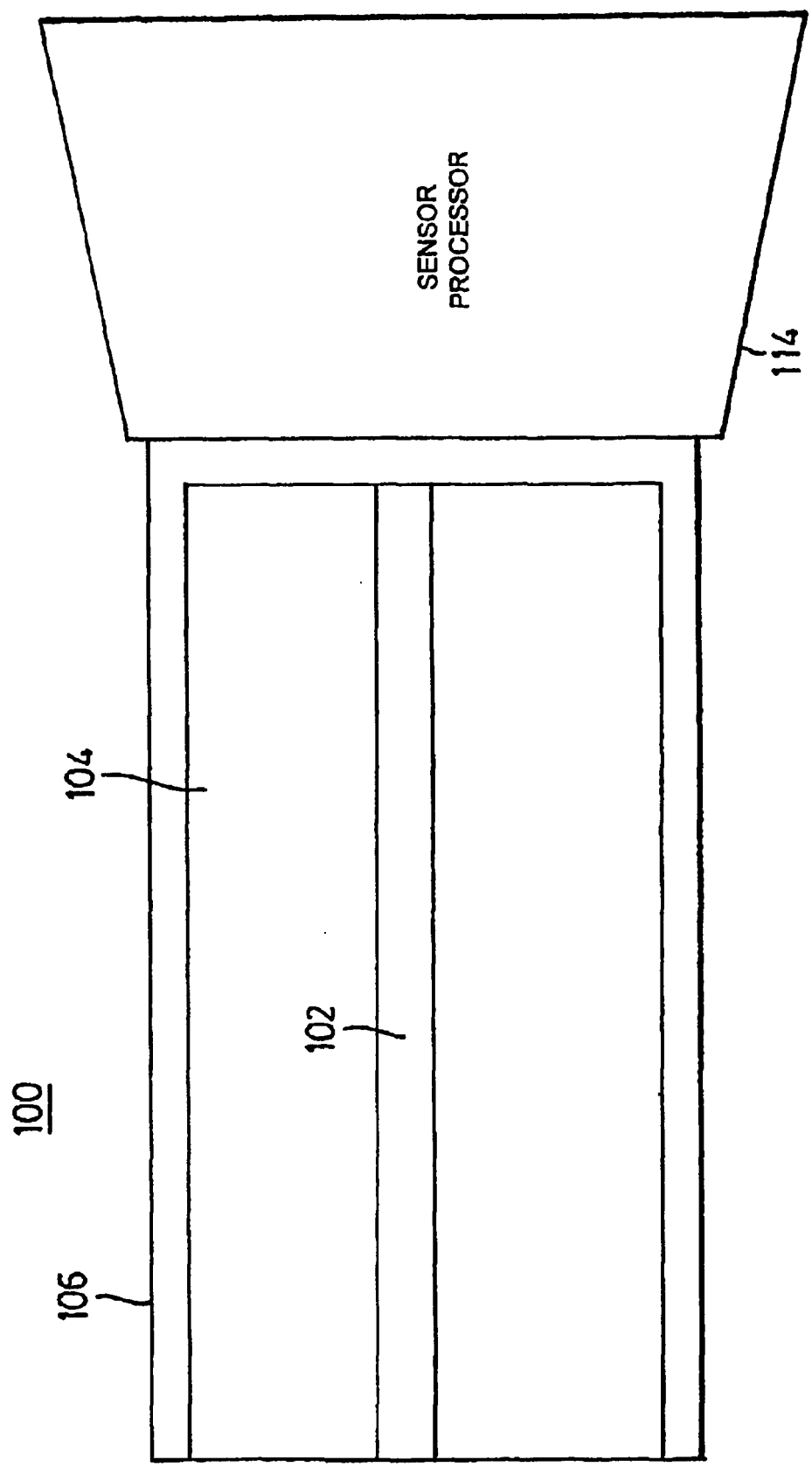
FIG. 1 is a top plan view of the capacitive proximity sensor, according to the present invention, depicting the sensor electrode, the capacitive shield, the dielectric and the sensor processor.
Figure 2:
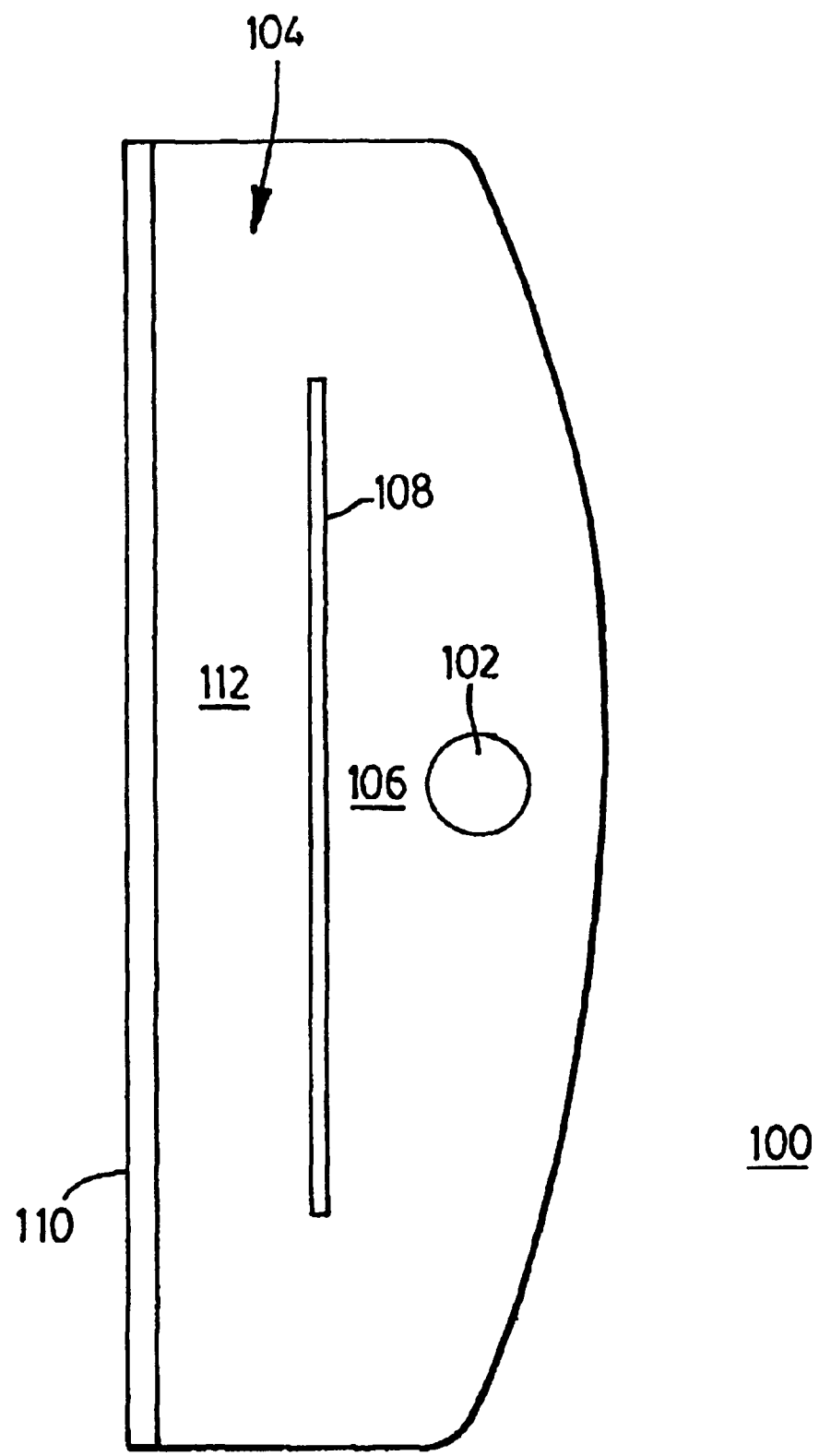
FIG. 2 is a longitudinal cross-sectional view of the proximity sensor shown in FIG. 1.

Turning now to FIGS. 1 and 2, a capacitive proximity sensor, denoted generally as 100, is shown comprising a sensor electrode 102, a capacitive shield 104 and a dielectric 106. The sensor electrode 102 is used to detect the strength of the electric field in proximity to the sensor electrode 102, and comprises a straight elongate electrically-conductive wire. Preferably, the sensor electrode 102 has a substantially circular or flat transverse cross-section. The suggested shapes for the sensor electrode 102 increase the surface area of the sensor electrode 102, thereby enhancing the sensitivity of the proximity sensor 100. However, other conductor shapes and orientations may be utilized in accordance with the application of the proximity sensor 100.

The capacitive shield 104 is configured to provide partial capacitive shielding for the sensor electrode 102. The capacitive shield 104 comprises an electrically-conductive metal sheet 108, an adhesive layer 110, and a dielectric layer 112 interposed between the adhesive layer 110 and the metal sheet 108. Preferably, the metal sheet 108 comprises a substantially planar metal sheet and is disposed substantially parallel to the longitudinal axis of the sensor electrode 102. Further, as shown, for proper shielding of the sensor electrode 102, the area occupied by the metal sheet 108 is substantially greater than that of the sensor electrode 102.

The dielectric 106 is disposed between the capacitive shield 104 and the sensor electrode 102 and electrically isolates the sensor electrode 102 from the capacitive shield 104. Preferably, the dielectric 106 encloses the sensor electrode 102, thereby protecting the sensor electrode 102 from external impact. Further, preferably, the dielectric layer 112 of the capacitive shield 104 is integrally formed with the dielectric 106, such that the dielectric 106 and the dielectric layer 112 together form a unitary dielectric body which encloses the sensor electrode 102 and the metal sheet 108.

In addition to the sensor electrode 102, the capacitive shield 104 and the dielectric 106, preferably the proximity sensor 100 also includes a sensor processor 114 disposed within the dielectric layer 112 of the capacitive shield 104. However, the sensor processor 114 may also be disposed externally to the proximity sensor 100, if desired. Preferably, the sensor processor 114 comprises an Application Specific Integrated Circuit (ASIC), and is in electrical communication with the sensor electrode 102 for processing sense data received from the sensor electrode 102.

The sensor process 114 includes an I/O port connected to the proximity sensor 100, a voltage pulse train generator, a first electronic switch connected between the pulse train generator and the I/O port for applying voltage pulses to the proximity sensor 100, an internal storage capacitor, a second electronic switch connected between the storage capacitor and the I/O port for transferring electronic charge from the proximity sensor 100 to the storage capacitor, and a third electronic switch connected between the storage capacitor and ground for bleeding off any parasitic voltage resulting from the charge transfer.

In order to obtain the sense data from the sensor electrode 102, the sensor processor 114 is configured to apply voltage pulse trains from the pulse train generator to the sensor electrode 102 (by closing the first electronic switch), and to transfer the resulting charge from the proximity sensor 100 to the storage capacitor (by closing the second electronic switch) at the end of each pulse train. The sensor processor 114 is also configured to bleed off parasitic voltage effects resulting from the charge transfer (by momentarily closing the third electronic switch), at the end of each charge transfer.

The sensor processor 114 is able to detect objects in proximity to the proximity sensor 100, while also compensating for capacitive changes arising from environmental conditions (eg. humidity, temperature, dirt over the sensor electrode 102). To do so, the sensor processor 114 is configured to measure the cycle count of the storage capacitor after a predetermined number of charge transfer cycles, and to calculate an average quiescent cycle count value from the measured cycle count values. The sensor processor 114 is also configured to compare the rate of change of measured cycle counts against the rate of change in average quiescent cycle count value. If the measured cycle count exceeds the rate of change in average quiescent cycle count value, the sensor processor 114 assumes that the change in cycle count resulted from the presence of an object in proximity to the proximity sensor 100, rather than a change in environmental conditions.

Figure 3:
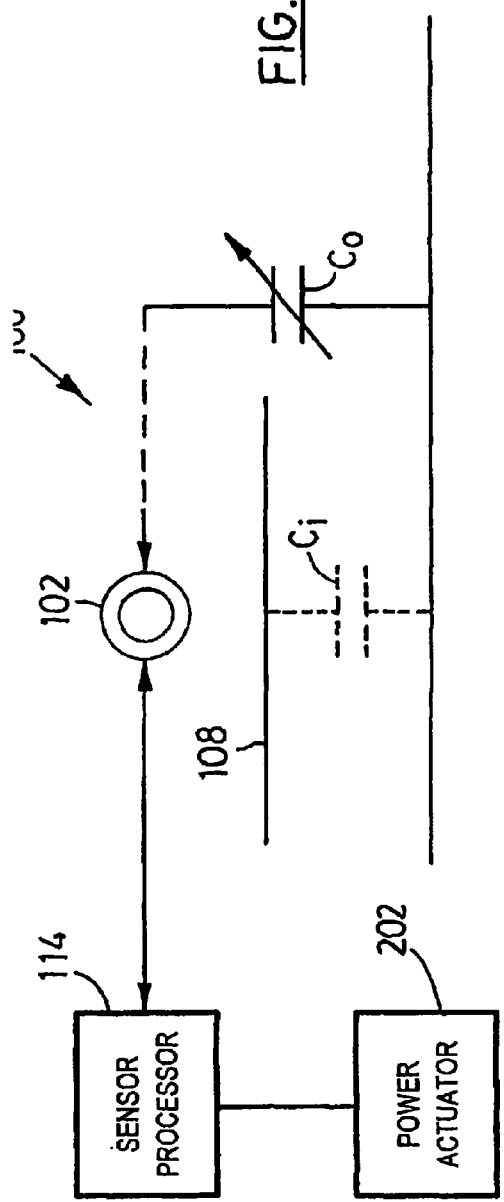
FIG. 3 is a schematic representation of the power accessory controller, according to the present invention, depicting the proximity sensor shown in FIG. 1, and the power accessory actuator coupled to the sensor processor.

FIG. 3 depicts the proximity sensor 100 implemented as a component of a power accessory controller. The proximity sensor 100 is secured to an automobile metal body part (eg. disposed within the rubber sealing strip of a window frame or a power sliding door), with the sensor processor 114 being connected to the automobile's power actuator 202 (which controls the movement of the window pane in the window frame or the movement of the sliding door). In addition, the figure depicts the intrinsic capacitance Ci associated with the automobile, and the capacitance Co associated with an obstruction, such as a human hand.

Figure 4:
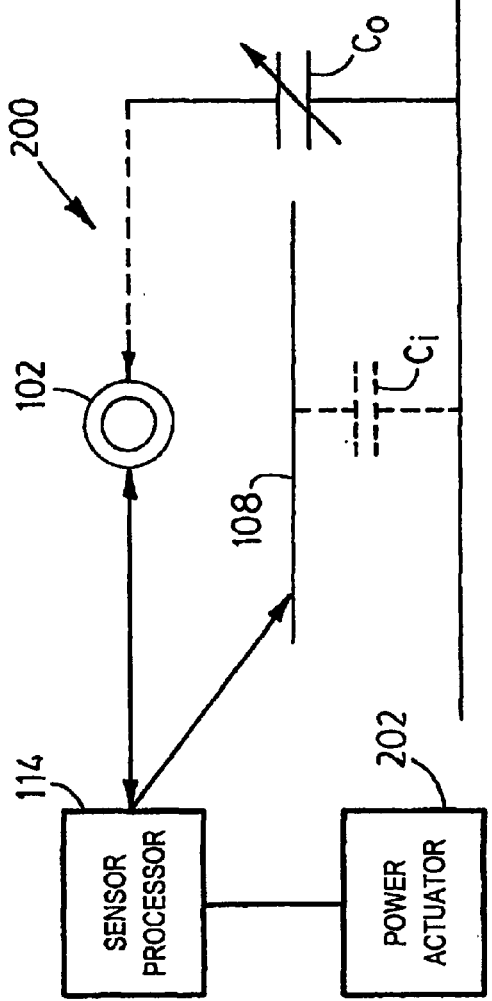
FIG. 4 is a schematic representation of one variation of the power accessory controller shown in FIG. 3.

FIG. 4 is a schematic representation of a proximity sensor 200 which is a variation of the proximity sensor 100. The proximity sensor 200 is substantially similar to the proximity sensor 100, and is implemented as a component of a power accessory controller. However, in contrast to FIG. 3, the sensor processor 114 of the proximity sensor 200 is in electrical communication with the sensor electrode 102 and the metal sheet 108 and is configured to transmit electrical pulses to the sensor electrode 102 and the metal sheet 108, and to process the resulting sense data received from the sensor electrode 102. This variation is advantageous since the electric field produced by the metal sheet 108 (due to the electrical pulses transmitted from the sensor processor 114) reduces the impact the steel body of the automobile body part can have on the shape of the electric field detected by the sensor electrode 102.

Figure 5:
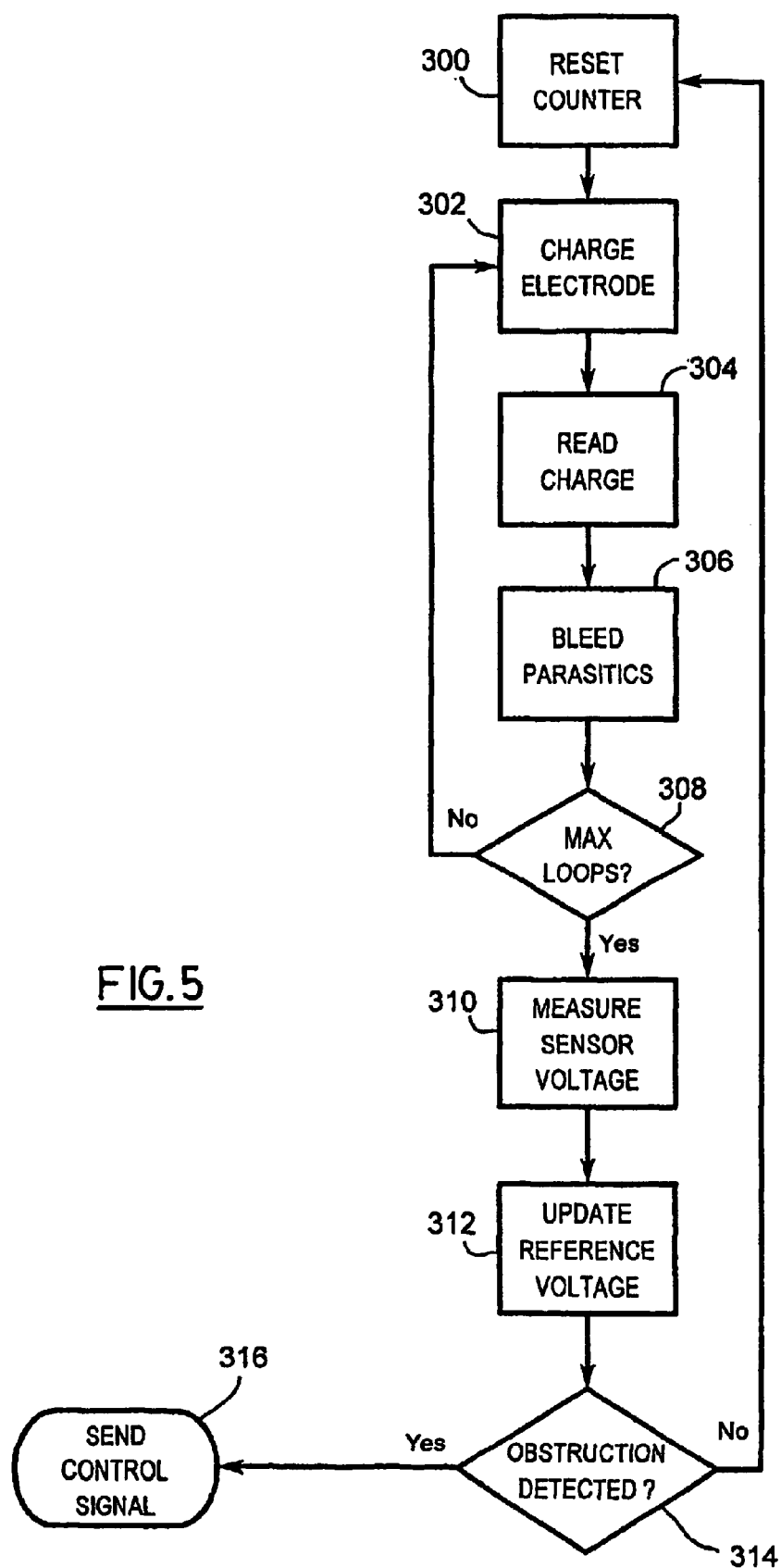
FIG. 5 is a flow chart depicting a proximity detection process using the proximity sensor.

The operation of the proximity sensor 100, 200 will now be described with reference to FIG. 5. At step 300, the sensor processor 114 resets a loop counter, removes all charge stored in the internal storage capacitor. The sensor processor 114 then transmits a train of electrical pulses to the sensor electrode 102 (or both the sensor electrode 102 and the metal sheet 108), at step 302, causing an electrical charge to be transferred to the sensor electrode 102. The sensor processor 114 transfers the charge stored on the sensor electrode 102 to the internal storage capacitor, at step 304. After the charge on the sensor electrode 102 is stored in the storage capacitor, at step 306 the sensor processor 114 bleeds off any parasitic voltage effects resulting from the charge transfer step (ie. step 304).

At step 308, the sensor processor 114 increments the loop counter, and then determines whether the loop counter has reached a predetermined maximum loop value. If the maximum loop value has not been reached, the sensor processor 114 repeats steps 302 to 306 again. However, if the maximum loop value has been reached, the sensor processor 114 measures the cycle count of the charge stored in the storage capacitor, at step 310. The pulse width of each electrical pulse and the number of electrical pulses transferred to the sensor electrode 102 (at step 302), and the maximum loop value are all selected in accordance with the length and type of the sensor electrode 102 such that the capacitive value of the sensor electrode 102 can be determined from the cycle count of the storage capacitor when the maximum loop value has been reached.

At step 312, the sensor processor 114 integrates all the sensor cycle count values (measured at step 310) to determine a reference quiescent sensor cycle count. Since the reference cycle count is determined dynamically, the reference cycle count varies in accordance with capacitive drift due to, for example, dirt over the sensor electrode 102. At step 314, the sensor processor 114 compares the instantaneous rate of change of the sensor cycle count with the average rate of change of the reference cycle count. If the instantaneous rate of change of the sensor cycle count exceeds the average rate of change of the reference cycle count (eg. due to the presence of a human hand in the window frame), the sensor processor 114 transmits an output control signal to the power actuator 202, at step 316, thereby alerting the power actuator 202 of the obstruction. Otherwise, the sensor processor 114 repeats steps 300 to 312.

If the sensor processor 114 detects an obstruction, the sensor processor 114 operatively effects the power actuator 202 to terminate movement of the accessory. Alternatively, the sensor processor 114 can effect the power actuator 202 to terminate and reverse movement of the accessory.

As will be apparent, the magnitude of the measured cycle count will vary in accordance with the area occupied by the sensor electrode 102, the magnitude of the gap between the sensor electrode 102 and the automobile body part, and the presence or absence of the obstruction capacitance Co. However, since the metal sheet 108 of the capacitive shield 104 is electrically isolated from the sensor electrode 102, and the metal sheet 108 is substantially larger in terms of area than the sensor electrode 102, the measured cycle count is not affected appreciably by the intrinsic capacitance Ci associated with the automobile.

If the power actuator 202 is directing the window pane of the automobile window frame (or the sliding door) to a closed position, upon receipt of the control signal the power actuator 202 immediately stops movement of the window pane (or sliding door). However, since the cycle count measured by the sensor processor 114 does not depend appreciably on the intrinsic capacitance Ci associated with the automobile, the presence of a cycle count differential due to the obstruction capacitance Co will be more readily identified than if the measured cycle count was affected by the intrinsic capacitance Ci. Consequently, the requisite output control signal to the power actuator 202 will be produced more rapidly and more reliably than with proximity sensor configurations which lack the capacitive shield 104.

The present invention is defined by the claims appended hereto, with the foregoing description being illustrative of the preferred embodiment of the invention. Those of ordinary skill may envisage certain additions, deletions and or modifications to the described embodiment, which although not explicitly suggested herein, do not depart from the scope of the invention, as defined by the appended claims.

What is claimed is:

1. A capacitive proximity sensor comprising:
   an elongate sensor electrode;
   a conductive metal sheet extending significantly beyond the sensor electrode;
   a dielectric disposed between the metal sheet and the sensor electrode;
   a substrate layer; and
   a dielectric layer interposed between the substrate layer and the conductive metal sheet and bonded to the substrate and the metal sheet.

2. The proximity sensor according to claim 1, wherein the elongate sensor electrode has a transverse cross-section, the cross-section comprising one of a circular and a rectangular cross-section.

3. The proximity sensor according to claim 2, wherein the metal sheet comprises a substantially planar conductive metal sheet, and provides partial capacitive shielding for the sensor electrode.

4. The proximity sensor according to claim 3, wherein dielectric layer is integrally formed with the dielectric.

5. A power accessory controller for an automobile, comprising:
   an elongate sensor electrode;
   a capacitive shield extending significantly beyond the sensor electrode;
   a dielectric disposed between the capacitive shield and the sensor electrode and bonded to the sensor electrode from the capacitive shield;
   a sensor processor in electrical communication with the sensor electrode for processing sense data received from the sensor electrode; and
   a power accessory actuator in electrical communication with the sensor processor for effecting movement of the accessory in accordance with the processed sense data.

6. The power accessory controller according to claim 5, wherein the elongate sensor electrode comprises a wire having a transverse cross-section, the cross-section comprising one of a circular and a rectangular cross-section.

7. The power accessory controller according to claim 6, wherein the sensor processor is configured to compensate for capacitive changes arising from environmental conditions.

8. The power accessory controller according to claim 7, wherein the sensor processor is configured to detect an obstruction when a rate of change of the sense data exceeds a rate of change of the capacitive compensation.

9. The power accessory controller according to claim 8, wherein the sensor processor is configured to compensate for the environmental conditions by determining an average quiescent value for the measured cycle count.

10. The power accessory controller according to claim 9, wherein and the sensor processor is configured to receive the sense data by applying trains of voltage pulses to the sensor electrode and the metal sheet, and measuring a cycle count at the sensor electrode at the end of each pulse train, and is also configured to compensate for the environmental conditions by determining an average quiescent value for the measured cycle count.

11. The power accessory controller according to claim 8, wherein the sensor processor is configured to receive the sense data by applying trains of cycle count pulses to the sensor electrode, and measuring a cycle count at the sensor electrode at the end of each pulse train.

12. The power accessory controller according to claim 11, wherein the capacitive shield comprises a conductive metal sheet providing partial capacitive shielding for the sensor electrode, a substrate configured for attachment to the automobile, and a dielectric layer interposed between the substrate and the conductive metal sheet and bonded to the substrate and the metal sheet.

13. The power accessory controller according to claim 12, wherein the sensor processor comprises an application specific integrated circuit disposed within the dielectric layer.

14. The power accessory controller according to claim 13, wherein the sensor processor after detecting an obstruction, operatively effects said actuator to terminate said movement.

15. The power accessory controller according to claim 14, wherein the sensor processor after effecting said actuator to terminate said movement, operatively effects said actuator to effect movement of said accessory in an opposite direction.

16. The power accessory controller according to claim 5, wherein the elongate sensor electrode has a transverse cross-section, the cross-section comprising one of a circular and a rectangular cross-section.

17. The power accessory controller according to claim 16, wherein the metal sheet comprises a substantially planar conductive metal sheet, and provides partial capacitive shielding for the sensor electrode.

18. The power accessory controller according to claim 17, wherein dielectric layer is integrally formed with the dielectric.

* * * * *